(12) United States Patent
Amarù et al.

(10) Patent No.: US 10,380,309 B2
(45) Date of Patent: Aug. 13, 2019

(54) BOOLEAN LOGIC OPTIMIZATION IN MAJORITY-INVERTER GRAPHS

(71) Applicant: ECOLE POLYTECHNIQUE FEDERALE DE LAUSANNE (EPFL), Lausanne (CH)

(72) Inventors: Luca Gaetano Amarù, Jouxtens-Mezery (CH); Pierre-Emmanuel Julien Marc Gaillardon, Renens (CH); Giovanni De Micheli, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 14/727,114

(22) Filed: Jun. 1, 2015

(65) Prior Publication Data

US 2016/0350469 A1 Dec. 1, 2016

(51) Int. Cl.
G06F 17/50 (2006.01)

(52) U.S. Cl.
CPC ........ *G06F 17/5081* (2013.01); *G06F 17/505* (2013.01)

(58) Field of Classification Search
CPC .......................... G06F 17/505; G06F 17/5081
See application file for complete search history.

(56) References Cited

U.S. PATENT DOCUMENTS 6,006,023 A 12/1999 Higashida
7,417,468 B2 8/2008 Verbauwhede et al.
(Continued)

OTHER PUBLICATIONS

Abbott, J. C., General Editor, "Trends in Lattice Theory," Part IV: Universal Algebra by George Grätzer, Van Nostrand Reinhold Company, 1970, title page and pp. 173-210.
(Continued)

*Primary Examiner* — Vuthe Siek
*Assistant Examiner* — Aric Lin
(74) *Attorney, Agent, or Firm* — Nixon & Vanderhye PC

(57) ABSTRACT

We present a Boolean logic optimization framework based on Majority-Inverter Graph (MIG). An MIG is a directed acyclic graph consisting of three-input majority nodes and regular/complemented edges. Current MIG optimization is supported by a consistent algebraic framework. However, when algebraic methods cannot improve a result quality, stronger Boolean methods are needed to attain further optimization. For this purpose, we propose MIG Boolean methods exploiting the error masking property of majority operators. Our MIG Boolean methods insert logic errors that strongly simplify an MIG while being successively masked by the voting nature of majority nodes. Thanks to the data-structure/methodology fitness, our MIG Boolean methods run in principle as fast as algebraic counterparts. Experiments show that our Boolean methodology combined with state-of-art MIG algebraic techniques enable superior optimization quality. For example, when targeting depth reduction, our MIG optimizer transforms a ripple carry adder into a carry look-ahead one. Considering the set of IWLS'05 (arithmetic intensive) benchmarks, our MIG optimizer reduces by 17.98% (26.69%) the logic network depth while also enhancing size and power activity metrics, with respect to ABC academic optimizer. Without MIG Boolean methods, i.e., using MIG algebraic optimization alone, the previous gains are halved. Employed as front-end to a delay-critical 22-nm ASIC flow (logic synthesis+physical design) our MIG optimizer reduces the average delay/area/power by (15.07%, 4.93%, 1.93%), over 27 academic and industrial benchmarks, as compared to a leading commercial ASIC flow.

4 Claims, 5 Drawing Sheets

(56) References Cited

U.S. PATENT DOCUMENTS

| | | |
|---|---|---|
| 7,492,015 B2 | 2/2009 | Chen et al. |
| 7,795,907 B1 | 9/2010 | Wang |
| 7,894,242 B2 | 2/2011 | Kuenemund et al. |
| 7,956,669 B2 | 6/2011 | Chuang et al. |
| 9,130,568 B2 | 9/2015 | Amaru et al. |
| 2001/0013797 A1 | 8/2001 | Hirairi |
| 2011/0169067 A1 | 7/2011 | Ernst et al. |
| 2014/0043060 A1 | 2/2014 | Amaru et al. |

OTHER PUBLICATIONS

Amarú, Luca, et al., "BDS-MAJ: A BDD-based Logic Synthesis Tool Exploiting Majority Logic Decomposition," Proc. DAC, 2013, 6 pages.

Amarú, Luca, et al., "Majority-Inverter Graph: A Novel Data-Structure and Algorithms for Efficient Logic Optimization," Proc. DAC, 2014, 6 pages.

Brayton, R. K., "Factoring logic functions," IBM J. Res. Develop., vol. 31, No. 2, Mar. 1987, pp. 187-198.

Brayton, R. K., et al., "Multilevel Logic Synthesis," Proceedings of the IEEE, vol. 78, No. 2, Feb. 1990, pp. 264-300.

Brayton, Robert K, et al., "MIS: A Multiple-Level Logic Optimization System," IEEE Transactions on Computer-Aided Design, vol. CAD-6, No. 6, Nov. 1987, pp. 1062-1081.

De Micheli, Giovanni, "Synthesis and Optimization of Digital Circuits," McGraw-Hill, New York, 1994, cover, table of contents, preface and title page (12 pages).

Isbell, John R., "Median Algebra," Transactions of the American Mathematical Society, vol. 260, No. 2, Aug. 1980, pp. 319-362.

Knuth, Donald E., "The Art of Computer Programming," vol. 4A, Part 1, Addison-Wesley, New Jersey, 2011, brief description and table of contents, 1 page.

Mishchenko, Alan, et al., "Using Simulation and Satisfiability to Compute Flexibilities in Boolean Networks," IEEE Transactions on Computer-Aided Design of Integrated Circuits and Systems, vol. 25, No. 5, May 2006, pp. 743-755.

Mishchenko, Alan, et al., "Boolean Factoring and Decomposition of Logic Networks," Proc. ICCAD, 2008, 7 pages.

Mishchenko, Alan, et al., "Scalable Don't-Care-Based Logic Optimization and Resynthesis," ACM Transactions on Reconfigurable Technology and Systems, vol. 4, No. 4, Article 34, Dec. 2011, pp. 34:1-34:23.

Muroga, Saburo, et al., "The Transduction Method-Design of Logic Networks Based on Permissible Functions," IEEE Transactions on Computers, vol. 38, No. 10, Oct. 1989, pp. 1404-1424.

Parnas, Michal, et al., "Proclaiming Dictators and Juntas or Testing Boolean Formulae," Combinatorial Optimization, Springer, Aug. 5, 2001, 31 pages.

Sentovich, Ellen M., et al., "SIS: A System for Sequential Circuit Synthesis," Electronics Research Laboratory, Memorandum No. UCB/ERL M92/41, Department of Electrical Engineering and Computer Science, University of California, Berkeley, May 4, 1992, 52 pages.

Vemuri, Navin, et al., "BDD-based Logic Synthesis for LUT-based FPGAs," ACM Transactionns on Design Automation of Electronic Systems, vol. 7, Issue 4, 2002, 26 pages.

Yang, Congguang, et al., "BDS: A BDD-Based Logic Optimization System," IEEE Transactions on Computer-Aided Design of Integrated Circuits and Systems, vol. 21, No. 7, Jul. 2002, pp. 866-876.

ABC: A System for Sequential Synthesis and Verification, http://www.eecs.berkeley.edu/~alanmi/abc/, Feb. 1, 2016, 2 pages.

Majority-Inverter Graph (MIG), A New Paradigm for Logic Optimization, http://lsi.epfl.ch/MIG, Feb. 1, 2016, 3 pages.

Ben-Jamaa, M. Haykel, et al., "An Efficient Gate Library for Ambipolar CNTFET Logic," IEEE Transactions on Computer-Aided Design of Integrated Circuits and Systems, vol. 30, No. 2, Feb. 2011, pp. 242-255.

Colli, Alan et al., "Top-Gated Silicon Nanowire Transistors in a Single Fabrication Step," ACS Nano, vol. 3, No. 6, 2009, pp. 1587-1593.

De Marchi, M., et al., "Polarity Control in Double-Gate, Gate-All-Around Vertically Stacked Silicon Nanowire FETs," Proc. IEDM, 2012, pp. 183-186.

De Marchi, Michele, et al., "Regular Fabric Design with Ambipolar CNTFETs fir FPGA and Structured ASIC Applications," IEEE/ACM International Symposium on Nanoscale Architectures, 2010, pp. 65-70.

Harada, Naoki, et al., "A polarity-controllable graphene inverter," Applied Physics Letters, vol. 96, 2010, pp. 012102-1 to 012102-3.

Heinze, S., et al., "Unexpected scaling of the performance of carbon nanotube Schottky-barrier transistors," Physical Review B, vol. 68, 2003, pp. 235418-1 to 235418-5.

Heller, Lawrence G., et al., "Cascode Voltage Switch Logic: A Differential CMOS Logic Family," IEEE International Solid-State Circuits Conference, 1984, pp. 16-17.

Jabeur, K., et al., "High performance 4:1 multiplexer with ambipolar double-gate FETs," IEEE Proc., 2011, pp. 677-680.

Kao, James, et al., "MTCMOS Hierarchical Sizing Based on Mutual Exclusive Discharge Patterns," Design Automation Conference Proceedings, Jun. 1998, pp. 495-500.

Kawaguchi, Hiroshi, et al., "A Super Cut-Off CMOS (SCCMOS) Scheme for 0.5-V Supply Voltage with Picoampere Stand-By Current," IEEE Journal of Solid-State Circuits, vol. 35, No. 10, Oct. 2000, pp. 1498-1501.

Koo, Sang-Mo, et al., "Enhanced Channel Modulation in Dual-Gated Silicon Nanowire Transistors," Nano Letters, vol. 5, No. 12, 2005, pp. 2519-2523.

Lin, Yu-Ming, et al., "High-Performance Carbon Nanotube Field-Effect Transistor With Tunable Polarities," IEEE Transactions on Nanotechnology, vol. 4, No. 5, Sep. 2005, pp. 481-489.

Ng, Ricky M. Y., et al., "A New Approach to Fabricate Vertically Stacked Single-Crystalline Silicon Nanowires," IEEE Proc. EDSSC, 2007, pp. 133-136.

Novoselov, K. S., et al., "Electric Field Effect in Atomically Thin Carbon Films," Science, vol. 306, Oct. 22, 2004, pp. 666-669.

Sacchetto, Davide, et al., "Ambipolar Gate-Controllable SiNW FETs for Configurable Logic Circuits With Improved Expressive Capability," IEEE Electron Device Letters, vol. 33, No. 2, Feb. 2012, pp. 143-145.

Sacchetto, Davide, et al., "Ambipolar silicon nanowire FETs with stenciled-deposited metal gate," Microelectronic Engineering, vol. 88, 2011, pp. 2732-2735.

Sacchetto, Davide, et al., "Fabrication and Characterization of Vertically Stacked Gate-All-Around Si Nanowire FET Arrays," IEEE ESSDERC, 2009, 4 pages.

Zukoski, Andrew, et al., "Universal Logic Modules Based on Double-Gate Carbon Nanotube Transistors," Design Automation Conference Proceedings, Jun. 2011, pp. 884-889.

Algorithm 1 MIG Boolean Depth-Optimization Pseudocode
---
INPUT: MIG α                 OUTPUT: Optimized MIG α.
   while ∃ advantageous critical voters in α do
      $\{a,b\}$=search_critical_voters(α);// Critical voters $a, b$ searched
      $c$=size_bounded_root(α, $a, b$);// Proper error insertion root
      $x_1^n$=common_parents(α, $a, b$);// Nodes fed by both $a$ and $b$
      $c^A = c^{b/a'}$;// First faulty branch
      $c^B = c^{x_1^n/a}$;// Second faulty branch
      $c^C = c^{x_1^n/b}$;// Third faulty branch
      MIG-depth_Alg_Opt($c^A$);// Reduce the faulty branch height
      MIG-depth_Alg_Opt($c^B$);// Reduce the faulty branch height
      MIG-depth_Alg_Opt($c^C$);// Reduce the faulty branch height
      $c = M(c^A, c^B, c^C)$;// Link the faulty branches
      MIG-depth_Alg_Opt($c$); // Last Gasp
      if depth($c$) is not reduced then
         revert to previous MIG state;
      end if
   end while

Fig. 4

| sub-set | $x$ | $y$ | $z$ | $f$ |
|---|---|---|---|---|
| $x = y = z$ | 0 | 0 | 0 | $f_0$ |
| $x = y = z'$ | 0 | 0 | 1 | $f_1$ |
| $x \neq y$ | 0 | 1 | 0 | $f_2$ |
| $x \neq y$ | 0 | 1 | 1 | $f_3$ |
| $x \neq y$ | 1 | 0 | 0 | $f_4$ |
| $x \neq y$ | 1 | 0 | 1 | $f_5$ |
| $x = y = z'$ | 1 | 1 | 0 | $f_6$ |
| $x = y = z$ | 1 | 1 | 1 | $f_7$ |

Fig. 5

| Adder type | Inputs | Outputs | Original AIG | | Optimized MIG | |
|---|---|---|---|---|---|---|
| | | | Size | Depth | Size | Depth |
| 2-op 32 bit | 64 | 33 | 352 | 96 | 610 | 12 |
| 2-op 64 bit | 128 | 65 | 704 | 192 | 1159 | 11 |
| 2-op 128 bit | 256 | 129 | 1408 | 384 | 14672 | 19 |
| 2-op 256 bit | 512 | 257 | 2816 | 768 | 7650 | 16 |
| 3-op 32 bit | 96 | 32 | 760 | 68 | 1938 | 16 |
| 4-op 64 bit | 256 | 66 | 1336 | 136 | 2212 | 18 |

Fig. 6

| Open Cores IWLS'05 Benchmark | I/O | MLP | | | | | ABC | | | |
|---|---|---|---|---|---|---|---|---|---|---|
| | | Size | Depth | Power | MAJ% | Runtime | Size | Depth | Power | Runtime |
| DSP | 4365/4145 | 43681 | 34 | 30k | 15.02 | 12.54 | 44644 | 47 | 32k | 9.21 |
| ac97_ctrl | 2267/2262 | 12006 | 8 | 10k | 22.14 | 9.76 | 14292 | 11 | 12k | 9.88 |
| aes_core | 789/668 | 20518 | 19 | 15k | 11.78 | 10.68 | 21543 | 22 | 14k | 8.21 |
| des_area | 368/72 | 4882 | 24 | 3k | 15.14 | 0.63 | 4858 | 28 | 2.9k | 1.08 |
| des_perf | 9042/9038 | 81070 | 14 | 70k | 10.09 | 39.34 | 88317 | 17 | 69k | 22.92 |
| ethernet | 10710/10728 | 62301 | 17 | 35k | 20.77 | 20.28 | 86656 | 22 | 53k | 25.99 |
| i2c | 147/142 | 1049 | 9 | 0.8k | 15.06 | 0.21 | 1136 | 10 | 0.8k | 0.06 |
| mem_ctrl | 1204/1231 | 9555 | 17 | 6k | 24.25 | 0.51 | 9396 | 28 | 5k | 0.26 |
| pci_bridge32 | 3527/3534 | 21170 | 17 | 15k | 36.92 | 3.88 | 23461 | 19 | 16k | 3.22 |
| pci_spoci_ctrl | 89/80 | 793 | 11 | 0.4k | 22.57 | 0.05 | 1291 | 13 | 0.7k | 0.02 |
| sasc | 133/132 | 661 | 6 | 0.6k | 15.58 | 0.22 | 753 | 8 | 0.7k | 0.07 |
| simple_spi | 148/147 | 976 | 8 | 0.8k | 18.65 | 0.15 | 1033 | 10 | 0.8k | 0.07 |
| spi | 274/276 | 4953 | 19 | 3k | 23.04 | 1.79 | 5548 | 21 | 3k | 1.85 |
| ss_pcm | 106/98 | 436 | 6 | 0.4k | 14.91 | 0.05 | 400 | 7 | 0.3k | 0.03 |
| systemcaes | 930/819 | 10599 | 27 | 8k | 31.11 | 11.21 | 12532 | 31 | 10k | 5.05 |
| systemcdes | 314/258 | 2936 | 19 | 2.4k | 13.11 | 3.62 | 3147 | 21 | 2.4k | 1.95 |
| tv80 | 379/410 | 8076 | 31 | 5k | 40.20 | 8.95 | 9494 | 36 | 6k | 3.22 |
| usb_funct | 1894/1879 | 14926 | 18 | 12k | 25.05 | 12.62 | 15644 | 20 | 13k | 9.34 |
| usb_phy | 113/111 | 439 | 6 | 0.4k | 10.25 | 0.04 | 478 | 7 | 0.4k | 0.11 |
| IWLS'05 total | | 301027 | 310 | 217.80k | 372.39 (19.59%) | 136.99 | 344623 | 378 | 242.00k | 102.45 |
| Arithmetic HDL | | Size | Depth | Power | MAJ% | Runtime | Size | Depth | Power | Runtime |
| MUL32 | 64/64 | 9027 | 37 | 7.4k | 12.38 | 3.39 | 8630 | 43 | 7.2k | 1.80 |
| sqrt32 | 32/16 | 1923 | 170 | 1.7k | 26.00 | 1.20 | 1959 | 203 | 1.5k | 1.55 |
| diffeq1 | 355/289 | 33398 | 184 | 28k | 21.49 | 123.55 | 33632 | 303 | 26k | 18.91 |
| div16 | 32/32 | 2972 | 113 | 2.5k | 33.63 | 6.39 | 5016 | 137 | 3.6k | 2.21 |
| hammiug | 200/7 | 2034 | 59 | 1.7k | 10.72 | 18.99 | 2717 | 75 | 1.6k | 2.31 |
| MAC32 | 96/65 | 10529 | 40 | 8.3k | 12.00 | 5.53 | 10320 | 70 | 8k | 7.65 |
| metric_comp | 288/208 | 18529 | 75 | 12k | 15.39 | 22.43 | 20821 | 112 | 13k | 10.22 |
| revx | 20/25 | 7625 | 146 | 5.5k | 15.63 | 12.33 | 10135 | 181 | 6.5k | 19.45 |
| Arithmetic total | | 85997 | 824 | 67.30k | 146.70 (18.33%) | 193.81 | 93230 | 1124 | 67.40k | 64.10 |

Fig. 7

| Benchmark | MLP+ASIC flow $\mu m^2/ns/\mu W$ | ASIC flow $\mu m^2/ns/\mu W$ |
|---|---|---|
| MUL32 | 1841.76/0.52/1.82 | 1958.81/0.57/1.79 |
| diffeq1 | 3992.49/2.85/4.57 | 3908.15/3.38/4.50 |
| hamming | 361.50/0.87/0.56 | 395.00/0.98/0.59 |
| div16 | 720.45/1.56/0.27 | 950.07/1.83/0.35 |
| sqrt32 | 505.78/1.97/0.50 | 455.95/2.20/0.48 |
| DSP | 7123.41/0.47/2.45 | 7119.60/0.49/2.51 |
| ac97_ctrl | 2295.09/0.10/0.53 | 2398.90/0.12/0.55 |
| aes_core | 4597.55/0.23/1.54 | 5272.32/0.25/1.55 |
| des_area | 956.04/0.32/0.54 | 1084.60/0.36/0.53 |
| des_perf | 14790.03/0.18/9.75 | 15211.80/0.20/9.76 |
| ethernet | 11235.40/0.18/1.31 | 10950.19/0.23/1.39 |
| i2c | 210.13/0.10/0.04 | 210.04/0.11/0.04 |
| mem_ctrl | 1418.22/0.26/0.24 | 1418.22/0.34/0.25 |
| pci_bridge32 | 3209.76/0.25/0.68 | 3250.08/0.27/0.70 |
| pci_spoci_ctrl | 159.34/0.16/0.08 | 177.47/0.16/0.09 |
| sasc | 125.12/0.08/0.02 | 139.98/0.10/0.02 |
| simple_spi | 176.34/0.12/0.04 | 163.72/0.15/0.04 |
| spi | 623.16/0.24/0.21 | 550.95/0.30/0.18 |
| ss_pcm | 85.33/0.08/0.02 | 89.23/0.08/0.02 |
| systemcaes | 1380.07/0.31/0.54 | 1322.87/0.37/0.51 |
| systemcdes | 665.01/0.26/0.39 | 731.71/0.30/0.43 |
| tv80 | 1342.52/0.39/0.34 | 1295.10/0.49/0.37 |
| usb_funct | 2388.53/0.25/0.69 | 2359.15/0.26/0.68 |
| usb_phy | 111.15/0.05/0.02 | 115.73/0.07/0.02 |
| MAC32 | 2287.50/0.48/1.74 | 2502.68/0.61/1.92 |
| metric_comp | 3975.97/1.18/1.21 | 4606.42/1.41/1.41 |
| revx | 1506.39/1.92/1.76 | 1931.07/2.48/1.81 |
| Total | 67085.01/15.38/31.86 | 70569.81/18.11/32.49 |

Fig. 8

BOOLEAN LOGIC OPTIMIZATION IN MAJORITY-INVERTER GRAPHS

FIELD OF INVENTION

The invention is in the field of logic optimization.

BACKGROUND

Nowadays, Electronic Design Automation (EDA) tools are challenged by design goals at the frontier of what is achievable in advanced technologies. In this scenario, recent logic synthesis works considered (slower) Boolean methods [1]-[5] rather than (faster) algebraic methods [6]-[9] to obtain superior circuit realizations, in terms of speed, power and area. Indeed, it is desirable to spend more time in logic synthesis computation to get a better final design. However, with traditional tools, there is a limit after which spending more effort in logic synthesis, for example running complex Boolean methods, does not improve a circuit quality or even requires too long runtime [10]. To push this limit as far as possible, innovative data structures and manipulation laws are decisive.

Majority-Inverter Graph (MIG) is a promising data structure for logic optimization and synthesis recently introduced by [11]. An MIG is a directed acyclic graph consisting of three-input majority nodes and regular/complemented edges. MIG manipulation is supported by a consistent algebraic framework. Algebraic optimization of MIGs showed strong synthesis results. However, the heuristic and local (short-sighted) nature of MIG algebraic methods [11] might preclude global (far-sighted) optimization opportunities.

In the present application, we extend the capabilities of MIG logic optimization by developing powerful Boolean methods based on majority voting. The present MIG Boolean methods enforce simplification opportunities by inserting logic errors successively masked by MIG nodes. Thanks to the data-structure/methodology fitness, the present MIG Boolean methods have an efficient runtime, i.e., they can handle 100 k equivalent gates in less than a minute, on a standard laptop. The present Boolean methods are simple, yet powerful. Experiments combined with state-of-art MIG algebraic techniques show tremendous results. For example, when targeting depth reduction, the presently described MIG optimizer automatically transforms a ripple carry adder into a carry look-ahead one. Considering the set of IWLS'05 (arithmetic intensive) benchmarks, the present MIG optimizer reduces by 17.98% (26.69%) the logic network depth while also enhancing size and power activity metrics, with respect to ABC tool [13]. Without MIG Boolean methods, using MIG algebraic optimization alone, only (about) half of the aforementioned gains appeared in our experiments. Employed as front-end to a delay-critical 22-nm ASIC flow (logic synthesis+physical design) our MIG optimizer reduces the average delay/area/power by (15.07%, 4.93%, 1.93%), over 27 academic and industrial benchmarks, as compared to a leading commercial ASIC flow.

SUMMARY OF THE INVENTION

The invention provides a method for Boolean optimization of a logic circuit, comprising steps of:
a. providing an interpretation of the logic circuit in terms of
   3 Boolean variable majority operators M, with each of the majority operators being a function of a plurality of variables that returns a logic value assumed by more than half of the plurality of variables, and
   a single Boolean variable complementation operator,
b. providing a selective insertion of orthogonal logic errors, that strongly simplify the logic circuit and are successively masked by majority operators,
   whereby two different types of orthogonal logic errors are provided, namely
      critical voters orthogonal logic errors and
      input partitioning orthogonal logic errors,
c. providing algebraic majority-inverter graph optimization before and after the selective insertion of orthogonal logic errors,
d. combining the algebraic majority-inverter graph optimization and an orthogonal error-based Boolean majority-inverter graph optimization to reduce a delay of the logic circuit via following steps (i) to (v):
   (i) algebraic majority-inverter graph optimization;
   (ii) insertion of orthogonal logic errors via critical voters;
   (iii) algebraic majority-inverter graph optimization;
   (iv) insertion of input partitioning errors to reduce an area without increasing the delay; and
   (v) an iteration of steps (i, ii, iii, iv) till a reduction in delay is achieved;
e. combining the algebraic majority-inverter graph optimization and the orthogonal error-based Boolean majority-inverter graph optimization to reduce the area of a logic circuit via following steps (vi) to (ix):
   (vi) algebraic majority-inverter graph optimization;
   (vii) insertion of orthogonal logic errors via input partitioning method;
   (viii) algebraic majority-inverter graph optimization;
   (ix) insertion of critical voters errors to reduce the delay without increasing the area; and
   (x) an iteration of steps (vi, vii, viii, ix) till a reduction in area is achieved.

In a second aspect, the invention provides an Electronic Design Automation (EDA) tool implementing the method for Boolean optimization of a logic circuit as described herein above.

BRIEF DESCRIPTION OF THE FIGURES

The invention will be better understood by means of the description of preferred example embodiments and in reference to the drawings, wherein
FIG. 4 contains a description of an Algorithm 1;
FIG. 5 contains input division into 3 pairwise disjoint sub-sets;
FIG. 6 contains adder optimization results;
FIG. 7 shows results for MIG Boolean optimization;
and
FIG. 8 shows results for ASIC design at a commercial 22 nm technology node.

DESCRIPTION OF PREFERRED EXAMPLE EMBODIMENTS

The following description is organized as follows.
The section Background and Motivation provides a background on logic optimization and on MIGs.

The section Harnessing Voting Resilience in MIG discusses on the logic flexibility of MIGs, exploiting the intrinsic voting resilience of majority nodes.

The section Boolean Logic Optimization in MIG describes our Boolean optimization methodology based on MIGs.

The section Experimental results shows the experimental results for our MIG Boolean optimization employed either stand-alone or as front-end to a commercial ASIC design flow.

Lastly the section Conclusions concludes the description.

BACKGROUND AND MOTIVATION

This section gives a background on logic optimization and MIGs.

A. Logic Optimization

Logic optimization methods are usually divided into two groups: Algebraic methods, which are fast, and Boolean methods, which are slower but achieve better results [10]. Traditional algebraic methods treat a logic functions as a polynomial [6], [7]. Algebraic operations are selectively iterated over the entire logic circuits, until an improvement exists. Basic algebraic operations are extraction, decomposition, factoring, balancing and substitution [10]. Their efficient runtime is enabled by weak-division and kernel theory. Instead, Boolean methods handle the true nature of a logic function using Boolean identities as well as (global) don't cares (circuit flexibilities) to get a better solution [10], [12]. Boolean division and substitution techniques trade off runtime for better minimization quality. Most Boolean methods run on expressive data-structures, with ideally no ambiguity on the representation. Canonical logic representation forms, such as truth tables and binary decision diagrams, support efficiently Boolean methods. For example, Boolean decomposition based on binary decision diagrams can recognize re-structuring opportunities not visible by algebraic counterparts [3]-[5]. Modern optimization methodologies, and associated tools, use algebraic and Boolean methods in conjunction [9], [13], i.e., after a slow but powerful Boolean method is used, fast algebraic methods are repeated until an improvement exists.

B. Majority-Inverter Graph

Figure 1:
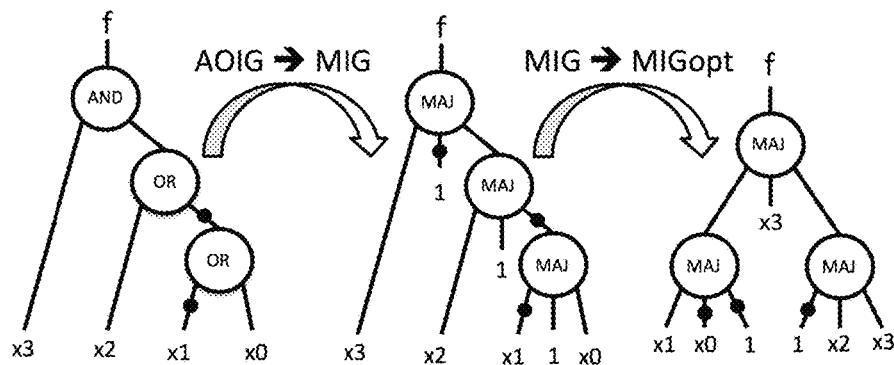
FIG. 1 illustrates an example of MIG representation.

A Majority-Inverter Graph (MIG) is a data structure for Boolean function representation and optimization. An MIG is a logic network consisting of 3-input majority nodes and regular/complemented edges [11]. Each majority node can be reduced to a conjunction (AND) or a disjunction (OR) operator by fixing the third input to 0 or to 1, respectively. It follows that any AND/OR-INV graphs (AOIG) can be emulated by a structurally identical MIG. In FIG. 1, an example AOIG is depicted with its structurally, and functionally, identical MIG. However, even better MIG representations appear by exploiting MIG nodes functionality (majority) rather than reducing it to AND/OR. Again in FIG. 1, a more compact MIG for the same example is depicted, having one fewer level of depth and the same number of nodes. To natively optimize and reach advantageous MIGs, like the one in FIG. 1, a MIG Boolean algebra is introduced in [11] and axiomatized ($\Omega$) by five primitive transformation rules as shown here after.

$$\Omega = \begin{cases} \text{Commutativity} - \Omega.C \\ M(x, y, z) = M(y, x, z) = M(z, y, x) \\ \text{Majority} - \Omega.M \\ \begin{cases} \text{if } (x = y): M(x, y, z) = x = y \\ \text{if } (x = y'): M(x, y, z) = z \end{cases} \\ \text{Associativity} - \Omega.A \\ M(x, u, M(y, u, z)) = M(z, u, M(y, u, x)) \\ \text{Distributivity} - \Omega.D \\ M(x, y, M(u, v, z)) = M(M(x, y, u), M(x, y, v), z) \\ \text{Inverter Propagation} - \Omega.I \\ M'(x, y, z) = M(x', y', z') \end{cases} \quad (1)$$

Some of these axioms are drawn from median algebra [14], [15] and others from the properties of the median operator in a distributive lattice [16]. From a theoretical perspective, it is possible to traverse the entire MIG representation space just by using a sequence of transformations drawn from $\Omega$[11]. However, deriving such a global sequence of $\Omega$ is an intractable problem. For this reason, current MIG optimization heuristics [11] focus on local $\Omega$ transformations. We call the MIG optimization techniques in [11] algebraic, because they locally use MIG algebra transformations.

In the present invention, we propose alternatives to these techniques, focusing on global properties of MIGs such as voting resilience and don't care conditions. Due to their global and general nature, we call our proposed MIG optimization methods "Boolean".

Harnessing Voting Resilience in MIG

MIGs are hierarchical majority voting systems. One notable property of majority voting is the capability to correct various types of bit-errors. This feature is inherited by MIGs, where error masking can be exploited for optimization purposes. One way for doing so is to purposely introduce logic errors that are successively masked by the voting resilience in MIG nodes. If such logic errors are advantageous, in terms of circuit simplifications, better MIG representations appear.

In the immediate following, we present the theoretical grounds for "safe error insertion" in MIGs, defining what type of errors, and at what overhead cost, can be introduced. Later on, we propose two intelligent procedures for "advantageous errors" insertion.

A. Inserting Safe Errors in MIG

Before we enter into the core theory of this work, we briefly review notations and definitions on logic errors [12], [17].

Definition

The logic error between an original function $f$ and its faulty version g is the Boolean difference $f \oplus g$.

In principle, a logic error can be determined for any two (potentially very different) circuits. In practical cases, a logic error is interpreted as a perturbation A on an original logic circuit $f$ [12].

Notation

A logic circuit $f$ affected by an error A is written as $f^A$.

For example, considering the function $f=(a+b)\cdot c$, an error A defined as "stuck variable b to 0" (A:b=0) leads to $f^A$=ac. In general, an error flips k entries in the truth table of the affected function. In the previous example, k=1. If k=0, the error is safe or permissible, as it does not change the original functionality [17].

To insert safe (permissible) errors in an MIG we consider a root node w and we triplicate it. In each version of w we introduce logic errors heavily simplifying the MIG. Then, we connect back the three faulty versions of w to a top majority node exploiting the error masking property. Unfortunately, a majority node cannot mask all types of errors. This limits our choice of permissible errors. Orthogonal errors, defined hereafter—For the sake of comprehension and conciseness, we present the theoretical concepts in an intuitive way, a formal treatment is directly derivable—, fit with our purposes. Informally, two logic errors are orthogonal if for any input pattern they cannot happen simultaneously.

Definition

Two logic errors A and B on a logic circuit $f$ are said orthogonal if $(f^A \oplus f) \cdot (f^B \oplus f) = 0$.

To give an example about orthogonal errors consider the function $f=(a+b) \cdot c$. Here, the two errors A:a+b=1 and B:c=0 are actually orthogonal. Indeed, by simple logic simplification, we get $(c \oplus f) \cdot (0 \oplus f) = (((a+b)c)'c+((a+b)c)') \cdot ((a+b)c) = ((a+b)c)'c \cdot ((a+b)c) = 0$. Instead, the errors A: a+b=1 and B: c=1 are not orthogonal for $f$. Indeed, for the input pattern (1, 1, 1) both A and B happen.

Now consider back a generic MIG root w. Say A, B and C three pairwise orthogonal errors on w. Being all pairwise orthogonal, a top majority node $M(w^A, w^B, w^C)$ is capable to mask A, B and C errors restoring the original functionality of w. This is formalized in the following theorem.

Theorem 3.1:

Say w a generic node in an MIG. Say A, B and C three pairwise orthogonal errors on w. Then the following equation holds: $w = M(w^A, w^B, w^C)$ Proof:

We show that $w \oplus M(w^A, w^B, w^C) = 0$. First, the $\oplus$ (XOR) operator propagates into the majority operator as $w \oplus M(w^A, w^B, w^C) = M(w^A \oplus w, w^B \oplus w, w^C \oplus w)$. Recalling that $M(a, b, c) = ab+ac+bc$ we rewrite the previous expression as $(w^A \oplus w) \cdot (w^B \oplus w) + (w^A \oplus w) \cdot (w^C \oplus w) + (w^B \oplus w) \cdot (w^C \oplus w)$. As A, B and C are pairwise orthogonal, we have that each term is 0, so 0+0+0=0. So, $w \oplus M(w^A, w^B, w^C) = 0$. Q.E.D.

Note that an MIG $w = M(w^A, w^B, w^C)$ can have up to three times the size and one more level of depth as compared to the original w. This means that simplifications enabled by orthogonal errors A, B and C must be significant enough to compensate for such overhead. Note also that our approach resembles triple modular redundancy but operates differently. Here, we exploit the error masking property in majority operators to enforce logic simplifications rather than covering potential hardware failures.

In the following, we present two methods for identifying advantageous triplets of orthogonal errors.

B. Critical Voters Method

A natural way to discover advantageous triplets of orthogonal errors is to analyze an MIG structure. We want to identify critical portions of an MIG to be simplified by these errors. To do so, we focus on nodes that have the highest impact on the final voting decision, i.e., influencing most a function computation. We call such nodes critical voters of an MIG. Critical voters can also be primary input themselves. To determine the critical voters, we rank MIG nodes based on a criticality metric. The criticality computation goes as follows. Consider a MIG node, say m. We label all MIG nodes whose computation depends on m. For all such nodes, we calculate the impact of m by propagating a unit weight value from m outputs up to the root with an attenuation factor of ⅓ each time a majority node is encountered. We finally sum up all the values obtained and call this result criticality of m. Intuitively, MIG nodes with the highest criticality are critical voters. For the sake of clarity, we give an example of criticality computation in FIG. 2. Node m5 has criticality of 0, as it is the root. Node m4 has criticality of ⅓ (a unit weight propagated to m5 and attenuated by ⅓). Node m3 has criticality of ⅓ (m4)+(⅓+1)/3 (direct and m4 contribution to m5) which sums up to ⅞. Node m2 has criticality of ⅓ (m3)+4/9(m4)+7/27(m5) which sums up to 28/27. Node m1 has criticality ⅓+criticality of m2 attenuated by factor 3 which sums up to about ⅔. Among the inputs, only x1 has a notable criticality being ⅓ (m3)+⅑(m4)+(⅓+⅑+1)/3 (m5) which sums up to 25/27. Here the two elements with highest criticality are m2 and x1.

Figure 2:
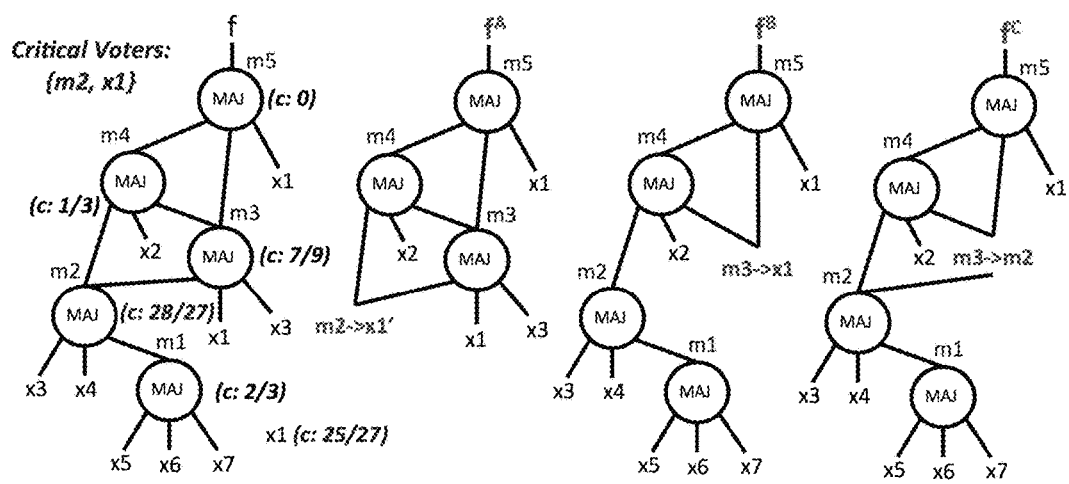
FIG. 2 illustrates an example of criticality computation and orthogonal errors.

Given two critical voters a and b and the set of MIG nodes fed by both a and b, say $\{c_1, c_2, \ldots, c_n\}$, an advantageous triplet of orthogonal errors is: A: a=b', B: $c_1=a, c_2=a, \ldots, c_n=a$ and C: $c_1=b, c_2=b, \ldots, c_n=b$. Considering back the example in FIG. 2 the critical voters are a=m2 and b=x1 while $c_1$=m3. Here, the pairwise orthogonal errors are m2=x1' (A), m3=x1 (B) and m3=m2 (C) as shown in FIG. 2. The actual orthogonality of A, B and C type of errors is proved in the following.

Theorem 3.2:

Say a and b two critical voters in an MIG. Say $\{c_1, c_2, \ldots, c_n\}$ the set of MIG nodes fed by both a and b in the same polarity. The following errors are pairwise orthogonal: A: a=b', B: $c_1=a, c_2=a, \ldots, c_n=a$ and C: $c_1=b, c_2=b, \ldots, c_n=b$.

Proof:

Starting from an MIG w, we build the three faulty versions $w^A$, $w^B$ and $w^C$ as described above. We show that orthogonality holds for all 3 pairs. pair $(w^A, w^B)$ We need to show that $(w^A \oplus w) \cdot (w^B \oplus w) = 0$. The element $w^A \oplus w$ implies a=b, being the difference between the original and the faulty one with a=b' (a≠b). The element $w^B \oplus w$ implies $c_i \neq a$ ($c_i$=a'), being the difference between the original and the faulty one with $c_i$=a. However, if a=b then $c_i$ cannot be a', because $c_i=M(a, b, x)=M(a, a, x)=a \neq a'$ by construction. Thus, the two elements cannot be true at the same time making $(w^A \oplus w) \cdot (w^B \oplus w) = 0$. pair $(w^A, w^C)$ This case is symmetric to the previous one. pair $(w^B, w^C)$ We need to show that $(w^B \oplus w) \cdot (w^C \oplus w) = 0$. As we deduced before, the element $w^B \oplus w$ implies a ($c_i$=a'). Similarly, the element $w^C \oplus w$ implies $c_1 \neq b$ ($c_i$=b'). By the transitive property of equality and congruence in the Boolean domain $c_i \neq a$ and $c_i \neq b$ implies a=b. However, if a=b, then $c_i=M(a,b,x)=M(a,a,x)=M(b,b,x)=a=b$ which contradicts both $c_i \neq a$ and $c_i \neq b$. Thus, the two elements cannot be true simultaneously making $(w^B \oplus w) \cdot (w^C \oplus w) = 0$. Q.E.D.

Even though focusing on critical voters is typically a good strategy, sometimes other approaches can be also convenient. In the following, we present one of such substitute approaches.

C. Input Partitioning Method

As a complement to critical voters method, we propose a different way to derive advantageous triplets of orthogonal errors. In this case, we focus on the inputs rather than looking for internal MIG nodes. In particular, we search for inputs leading to advantageous simplifications when faulty. Similarly to the criticality metric in critical voters, we use here a decision metric, called dictatorship [18], to select the most profitable inputs. The dictatorship is the ratio of input patterns over the total ($2^n$) for which the output assumes the same value of the selected input [18]. For example, in the function $f=(a+b) \cdot c$, the inputs a and b have equal dictatorship of ⅝ while input c has an higher dictatorship of ⅞. The inputs with highest dictatorship are the ones where we want to insert logic errors. This is because they influence most a circuit functionality, and so also its structure. Considering back the example $f=(a+b)\cdot c$, suppose we are allowed to introduce a stuck at 0 error at one input. Applying this error to a or b inputs (with low dictatorship) we reduce the complexity to a single gate (ac or bc). However, if we introduce the same error on the input c (with high dictatorship) we further reduce the complexity just to a logic constant (0).

Exact computation of the dictatorship requires exhaustive simulation of an MIG structure, which is likely to be infeasible for practical functions of interest. Heuristic approaches to estimate dictatorship involve partial random simulation and graph techniques [18].

After dictatorship computation, we select a proper subset of the primary inputs. Next, for each selected input, we determine a condition that causes an error. We require these errors to be orthogonal. Since we operate directly on the primary inputs, we divide the Boolean space into disjoint sub-sets that are natively orthogonal. As we need three errors, we need to consider at least three inputs to be made faulty, say x, y and z. A possible division is the following: $\{x \neq y, x=y=z, x=y=z'\}$. The corresponding errors can be A: $x=y$ for $\{x \neq y\}$, B:$z=y'$ when $x=y$ for $\{x=y=z\}$ and C:$z=y$ when $x=y$ for $\{x=y=z'\}$. We formally prove that A, B and C are orthogonal errors hereafter.

Theorem 3.3:

Consider the input division into $\{x \neq y, x=y=z, x=y=z'\}$ in an MIG. Three errors A, B and C selectively affecting one subset but not the others are pairwise orthogonal.

Proof:

To prove the theorem it is sufficient to show that the division $\{x \neq y, x=y=z, x=y=z'\}$ is actually a partition of the whole Boolean space, i.e., a union of disjoint (non-overlapping) subsets. In FIG. 5, all the eight possible $\{x, y, z\}$ combinations are shown. The corresponding $\{x \cdot y, x=y=z, x=y=z'\}$ sub-sets are assigned in the left column. We visually see that all sub-sets are disjoint, i.e., they have no common input pattern. Moreover, all together, they form the whole Boolean space. Q.E.D.

So far, we have shown how "safe error insertion" in MIGs can be accomplished by means of different techniques. In the rest of the present description, we will exploit the logic opportunities deriving from "safe error insertion" in MIG optimization.

Boolean Logic Optimization in MIG

In this section, we propose Boolean optimization methods for MIGs by exploiting safe error insertion schemes. Our optimization procedures target depth and size reduction in MIGs. At the end of this section, we showcase our Boolean optimization capabilities for adder circuits.

A. Depth-Oriented Boolean Methods

The most intuitive way to exploit the voting resilience in MIGs is to reduce the number of levels. This is because the opening overhead of safe error insertion is just one additional level. Such extra level is usually well recovered during simplification and optimization of MIG faulty branches. For depth-optimization purposes, the critical voters method enables very good results. The reason is the following. Critical voters mostly appear on the critical path and re-converge on it. Thus, the possibility to insert simplifying errors on critical voters directly enables a strong reduction in the maximum number of levels.

Sometimes, using an actual MIG root as error insertion root requires an 3× size overhead which is unpractical. In these cases, we bound the critical voters search to sub-MIGs partitioned on a depth criticality basis. Once the critical voters and a proper error insertion root have been identified, three faulty sub-MIG versions are generated as explained in the previous section. On these sub-MIGs, we want to reduce the logic height. We do so by running algebraic MIG optimization on them. Note that, in principle, also MIG Boolean methods can be re-used. This would correspond to a recursive Boolean optimization. However, it turned out during experimentation that algebraic optimizations already produce satisfactory results at the local level. Thus, it makes more sense to apply Boolean techniques iteratively on the whole MIG structure rather than recursively on the same logic portion.

At the end of the faulty branches optimization, the new MIG-roots must be given in input to a top majority voting node to re-establish the functional correctness. A last gasp of MIG algebraic optimization is convenient at this point, to take advantage of the simplification opportunities arosen from the faulty branches integration. The above described optimization strategy is summarized in Algorithm 1 shown in FIG. 4.

Figure 3:
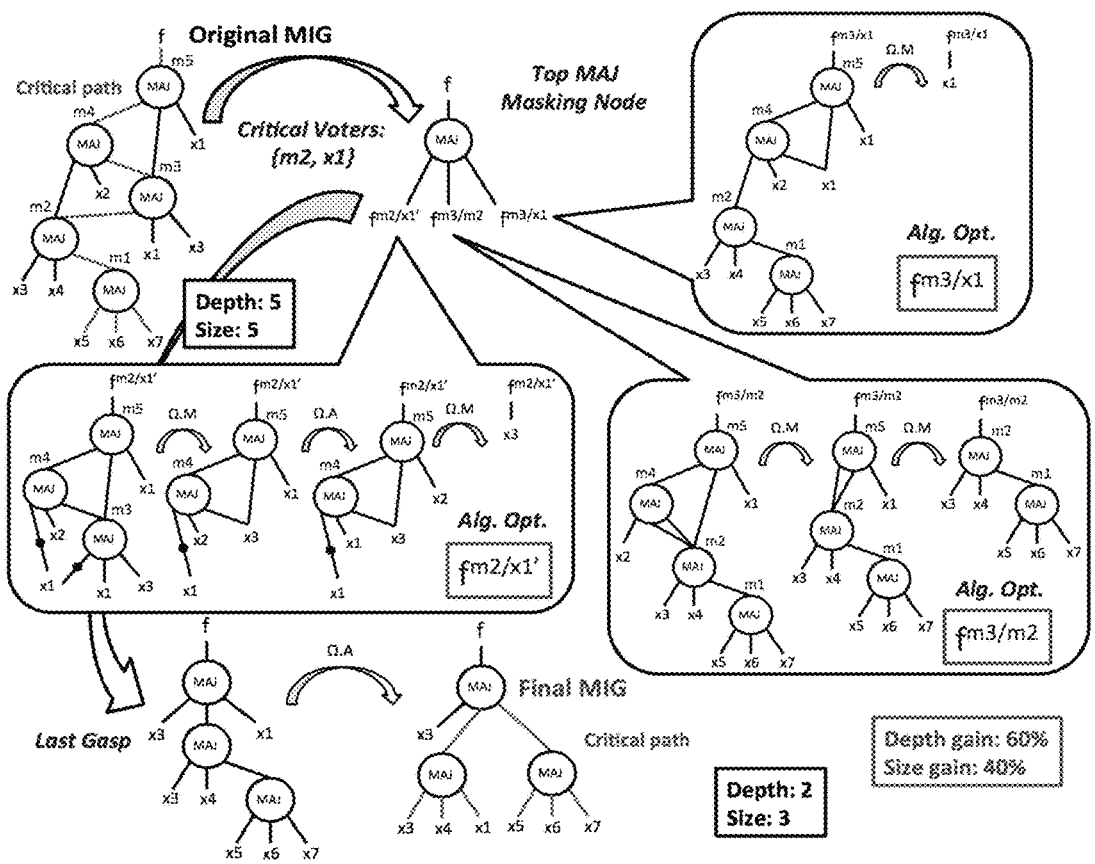
FIG. 3 illustrates a MIG Boolean depth-optimization example based on critical voters errors insertion. Final depth reduction: 60%, size reduction: 40%.

For the sake of clarity, we comment on Boolean MIG-depth optimization with a simple example, reported in FIG. 3. First, the critical voters are searched and identified, being in this example the input x1 and the node m2 (from FIG. 2). The proper error insertion root in this small example is the MIG root itself. So, three different versions of the root $f$ are generated with errors $f^{m2/x1'}$, $f^{m3/m2}$ and $f^{m3/x1}$. Each faulty branch is handled by fast algebraic optimization to reduce its depth. The detailed algebraic optimization steps involved are shown in FIG. 3. The most common operation is $\Omega \cdot M$ that directly simplifies the introduced errors. The optimized faulty branches are then linked together by a top fault-masking majority node. A last gasp of algebraic optimization on the final MIG structure further optimizes its depth. In summary, our MIG Boolean optimization techniques attains a depth reduction of 60% and, at the same time, a size reduction of 40%. On the other hand, by running just algebraic optimization on this example a depth reduction of 20% is possible at a size overhead cost of 50%.

B. Size-Oriented Boolean Methods

The voting resilience in an MIG can be also used to reduce its size. In this case, the branch triplication overhead imposes tight simplification requirements deriving from the inserted errors. In order to do so, we can still focus on critical voters and enforce more strict selection metrics. However, the benefit deriving from this approach is limited. A better solution is to change the type of error inserted and use the input partitioning method. Indeed, the input partitioning method focuses on the inputs that inflates most an MIG, and introduce selective simplification on them. The resulting Boolean optimization procedure is in principle identical to Alg. 1 but with depth techniques replaced by size techniques and critical voter search replaced by input partitioning methods. We do not discuss on the implementation details for MIG Boolean size optimization for the sake of brevity.

C. Case Study: Adders Optimization

Adders are hard to optimize circuits due to their inherent arithmetic nature. For this reason, they are good benchmarks to test the capabilities of logic optimization methods and associated tools. We bench our MIG Boolean depth optimization technique for different types of adders. We consider two, three and four operands adders, with bit widths ranging from 32 to 256. FIG. 6 shows the optimization results. Our optimized MIG adders are 4 to 48× shorter than the original ones. In all cases, the optimized MIG structure resembles a carry-look ahead design which is known to be the most depth-efficient for adders. This is a remarkable results as standard synthesis engines cannot reach this level of automated optimization.

It is worth noticing that, even though very powerful, our Boolean MIG optimization is still a heuristic. This means that, on average, we get strong results but there is no guarantee on the degree of optimality. For example, the 2-operand 64 bit and 256 adders find early good critical voters enabling powerful depth minimization. On the other hand, 2-operand 32 bit and 128 adders do not find similar critical voters obtaining less depth reduction.

Original and our MIG-optimized Verilog files are downloadable at [19] for the sake of reproducibility.

Experimental Results

In this section, we test the performance of our MIG Boolean optimization methods on academic and industrial benchmarks. We run pure logic optimization experiments and complete design experiments on a 22-nm commercial ASIC flow.

A. Methodology

We developed a Majority-Logic manipulation Package (MLP) consisting of about 8k lines of C code. It embeds state-of art algebraic MIG optimization techniques [11] and the previously presented MIG Boolean optimization methods. As a global optimization flow, we focus on aggressive depth reduction interlaced with size recovery phases. For this purpose, we run algebraic optimization as long as improvements exist and then we run Boolean optimization to unlock further improvements. For our MIG Boolean depth-methods, we use critical voters search starting from tight selection constraints (enabling the largest advantage) and then decreasing till (i) a good pair of critical voters is found or (ii) a minimum threshold is reached. During size recovery, we employ Boolean methods based on input partitioning together with algebraic techniques. The MLP reads Verilog or AIGER format and writes back a Verilog description of the optimized MIG. We consider IWLS'05 Open Cores benchmarks and larger arithmetic HDL benchmarks (differential equation solvers, telecommunication units, sorters, specialized arithmetic units, etc.). All the input and output (Verilog) files from our experiments can be downloaded at [19], for the sake of reproducibility. In total, we optimized, and verified, ~0.5 million eq. gates over 27 benchmarks. For the pure logic optimization experiments, we use as counterpart tool the ABC academic synthesizer [13], with delay oriented script if—g;iresyn. For the complete design flow experiments, we consider a state-of-art 22-nm commercial ASIC flow suite (logic synthesis+place & route). In this case, our MLP package operates as a front-end to the flow. As the circuit speed is our main design goal, we use an ultra-high delay-effort script in the commercial tools.

B. Optimization Results

FIG. 7 shows the results for MIG Boolean optimization. For the IWLS'05 and HDL arithmetic benchmarks, we see a total improvements in all size, depth and power activity metrics, w.r.t. to AIG optimized by ABC. Since depth was our main optimization target, we notice there the largest reduction. Considering the IWLS'05 benchmarks, that are large but not tall, in terms of number of levels, we see a 17.98% reduction. At the same time, the size and power are reduced by 12.65% and 10.00%, respectively. Focusing on the arithmetic HDL benchmarks, we see a better depth reduction. Here, our MIG Boolean methodology enables a 26.69% depth reduction. At the same time, we reduce size and power by 7.7% and 0.1%.

FIG. 7 shows that the runtime of our tool is competitive with that of ABC tool. This confirms the scalability of our methods, handling 100k equivalent gates in less than a minute, on a standard laptop.

Even though we do not use the same set of benchmarks in [11], we still want to provide a comparison between algebraic and Boolean MIG techniques. On average over our IWLS+HDL benchmarks, only about half of the reported improvements were possible just using algebraic techniques in our tool. However, this still does not directly relate to the numbers reported in [11]. For the sake of comparison, we optimize four relevant MCNC benchmarks also appearing in [11]: my_adder, alu4, clma and s38417. In [11], they have 19, 14, 42 and 22 number of levels, respectively. With our new MLP tool featuring Boolean optimization we lowered these numbers to 9, 11, 21 and 17, respectively. Also size and power metrics are lowered. These experiments can be downloaded at [19].

All MIG output Verilog files underwent formal verification experiments (ABC cec and Synopsys Formality) with success.

C. ASIC Results

FIG. 8 shows the results for ASIC design (synthesis followed by place and route) at a commercial 22 nm technology node. In total, we see that using our MIG optimizer as front-end to the ASIC design flow we enable better final circuits, in all area, delay and power metrics. For the delay, that was our critical design constraint, we observe an improvement of 15.07%. This improvement is not as large as the one we saw at the logic optimization level. Indeed, some of that gain got absorbed by the interconnect overhead during physical design. However, we still see a coherent trend. Considering area and power we got reductions of 4.93% and 1.93%, respectively.

In summary, using the MIG Boolean technology we observe consistent, and global, advantages over a state-of-art commercial design flow. It is worth noticing that we employed our method just as a front-end to an existing commercial flow. We foresee even better results by integrating MIG optimization inside the synthesis engine.

Conclusion

In the present description, we presented a Boolean logic optimization framework based on Majority-Inverter Graph (MIG). We proposed MIG optimization methods taking advantage of the error masking property of majority operators. By inserting logic errors in an MIG, successively masked by majority nodes, we strongly simplified logic networks. Our Boolean methods are simple, yet powerful. Experiments combined with state-of-art MIG algebraic techniques shown tremendous results. For example, when targeting depth reduction, our MIG optimizer transformed ripple carry adders into a carry look-ahead ones. Over IWLS'05 and arithmetic HDL benchmarks, we reduced the logic network depth by 17.98% and 26.69%, respectively, while also improving size and power metrics. Employed as a front-end to a delay-critical 22-nm ASIC flow (logic synthesis+physical design) our MIG optimizer reduced the average delay/area/power by (15.07%, 4.93%, 1.93%), over 27 academic and industrial benchmarks, as compared to a leading commercial ASIC flow.

ACKNOWLEDGEMENTS

This research was supported by ERC-2009-AdG-246810.

REFERENCES

[1] A. Mishchenko, et al., *Using simulation and satisfiability to compute flexibilities in Boolean networks* IEEE TCAD 25.5 (2006): 743-755.

[2] A. Mishchenko, et al., *Scalable don't-care-based logic optimization and resynthesis*, ACM TRETS 4.4 (2011): 34.

[3] C. Yang, et al., *BDS: A BDD-based logic optimization system*, IEEE TCAD 21.7 (2002): 866-876.

[4] N. Vemuri, et al., *BDD-based logic synthesis for LUT-based FPGAs*, ACM TODAES 7.4 (2002): 501-525.

[5] L. Amarú, et al., *BDS-MAJ: a BDD-based logic synthesis tool exploiting majority logic decomposition*, Proc. DAC' 13.

[6] R. K. Brayton, et al., *The Decomposition and Factorization of Boolean Expressions*, Proc. ISCAS'82.

[7] R. K. Brayton, et al., *Factoring logic functions*, IBM Journal of Research and Development 31.2 (1987): 187-198.

[8] R. K. Brayton, et al., *MIS: A multiple-level logic optimization system*, IEEE TCAD 6.6 (1987): 1062-1081.

[9] E. Sentovich, et al., *SIS: A System for Sequential Circuit Synthesis*, ERL, Dept. EECS, Univ. California, Berkeley, UCB/ERL M92/41, 1992.

[10] R. K. Brayton, *Multilevellogicsynthesis*, Proc. IEEE78.2(1990):264-300.

[11] L. Amarú, et al., *Majority-Inverter Graph: A Novel Data-Structure and Algorithms for Efficient Logic Optimization*, Proc. DAC' 14.

[12] G. De Micheli, *Synthesis and Optimization of Digital Circuits*, McGraw-Hill, N.Y., 1994.

[13] ABC synthesis tool—http://www.eecs.berkeley.edu/alanmi/abc/.

[14] John R. Isbell, *Medianalgebra*, Trans. Amer. Math. Soc., 319-362, 1980.

[15] D. Knuth, *The Art of Computer Programming*, Volume 4A, Part 1, New Jersey: Addison-Wesley, 2011

[16] G. Birkhoff, *Lattice Theory*, Amer. Math. Soc., New York, 1967

[17] S. Muroga, et al., *The transduction method-design of logic networks based on permissible functions*, IEEE TCOMP, 38.10 (1989): 1404-1424.

[18] M. Parnas, et al., *Proclaiming dictators and juntas or testing boolean formulae*, Combinatorial Optimization, Springer, 2001. 273-285.

[19] Majority-Inverter Graphs circuits available at http://lsi.epfl.ch/MIG

The invention claimed is:

1. A method for Boolean optimization of a logic circuit performed on a computer to reduce a signal delay and a surface area of a chip for the logic circuit, the method comprising:

a. generating an expression by the computer of the logic circuit as an algebraic majority inverter graph with 3 Boolean variable majority operators M, with each of the majority operators being a function of a plurality of variables that returns a logic value assumed by more than half of the plurality of variables, and a single Boolean variable complementation operator, b. selectively inserting orthogonal logic errors into the expression by the computer that simplify the logic circuit and are successively masked by majority operators, the selectively inserting of orthogonal logic errors includes insertion of different types of orthogonal logic errors, the different types of orthogonal logic errors including critical voters orthogonal logic errors and input partitioning orthogonal logic errors, c. optimizing the algebraic majority-inverter graph before and after the selective insertion of orthogonal logic errors by the computer, d. combining the algebraic majority-inverter graph optimization and an orthogonal error-based Boolean majority-inverter graph optimization to reduce the signal delay of the logic circuit by the computer via:

(i) algebraic majority-inverter graph optimization;
(ii) insertion of orthogonal logic errors via critical voters;
(iii) algebraic majority-inverter graph optimization;
(iv) insertion of input partitioning errors to reduce the area without increasing the signal delay; and
(v) an iteration of (i, ii, iii, iv) until a reduction in signal delay is achieved;

e. combining the algebraic majority-inverter graph optimization and the orthogonal error-based Boolean majority-inverter graph optimization to reduce the area of the logic circuit by the computer via:

(vi) algebraic majority-inverter graph optimization;
(vii) insertion of orthogonal logic errors via input partitioning;
(viii) algebraic majority-inverter graph optimization;
(ix) insertion of critical voters errors to reduce the signal delay without increasing the area; and
(x) an iteration of (vi, vii, viii, ix) until a reduction in the area is achieved in generating a new logic circuit via performance of the Boolean optimization of the logic circuit.

2. An Electronic Design Automation (EDA) tool operated on the computer for performing the method for Boolean optimization of the logic circuit of claim 1.

3. The method of claim 1, wherein the orthogonal logic errors include two logic errors A and B on a logic circuit f that follow the equation $(f^A \oplus f) \cdot (f^B \oplus f) = 0$.

4. The method of claim 1, wherein the MIG nodes with a highest criticality are the critical voters, and the critical voters are determined by a criticality computation on the computer by calculating an impact of a selected MIG node on all other MIG nodes impacted by the selected MIG node by propagating a unit weight value with an attenuation factor each time a majority node is encountered.

* * * * *